(12) United States Patent
Djurdjevic et al.

(10) Patent No.: US 8,037,394 B2
(45) Date of Patent: *Oct. 11, 2011

(54) TECHNIQUES FOR GENERATING BIT RELIABILITY INFORMATION IN A POST-PROCESSOR USING AN ERROR CORRECTION CONSTRAINT

(75) Inventors: Ivana Djurdjevic, San Jose, CA (US); Bruce Alexander Wilson, San Jose, CA (US); Mario Blaum, San Jose, CA (US); Richard Leo Galbraith, Rochester, MN (US); Ksenija Lakovic, Menlo Park, CA (US); Yuan Xing Lee, San Jose, CA (US); Zongwang Li, San Jose, CA (US); Travis Roger Oenning, Rochester, MN (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 1138 days.

This patent is subject to a terminal disclaimer.

(21) Appl. No.: 11/771,783

(22) Filed: Jun. 29, 2007

(65) Prior Publication Data

US 2009/0006931 A1 Jan. 1, 2009

(51) Int. Cl.
*H03M 13/45* (2006.01)
(52) U.S. Cl. .................................................... 714/780
(58) Field of Classification Search .................. 714/769, 714/780, 795
See application file for complete search history.

(56) References Cited

U.S. PATENT DOCUMENTS

| | | | |
|---|---|---|---|
| 5,521,945 A * | 5/1996 | Knudson | 375/341 |
| 5,689,532 A | 11/1997 | Fitzpatrick | |
| 6,460,150 B1 * | 10/2002 | Cideciyan et al. | 714/709 |
| 6,513,141 B1 * | 1/2003 | Livingston | 714/792 |
| 6,522,705 B1 * | 2/2003 | Conway et al. | 375/341 |
| 6,581,181 B1 * | 6/2003 | Sonu | 714/795 |
| 6,694,477 B1 * | 2/2004 | Lee | 714/784 |
| 6,823,487 B1 * | 11/2004 | Poeppelman | 714/785 |
| 6,986,098 B2 * | 1/2006 | Poeppelman et al. | 714/807 |
| 7,012,974 B1 * | 3/2006 | Liu et al. | 375/340 |
| 7,089,483 B2 | 8/2006 | McEwen et al. | |
| 7,725,800 B2 * | 5/2010 | Yang et al. | 714/755 |
| 7,805,664 B1 * | 9/2010 | Yang et al. | 714/794 |

\* cited by examiner

*Primary Examiner* — Stephen Baker
(74) *Attorney, Agent, or Firm* — Steven J. Cahill

(57) ABSTRACT

Techniques are provided that generate bit reliabilities for a detected sequence. A detector generates the detected sequence. According to one embodiment, a post-processor finds a first set of combinations of one or more error events in the detected sequence satisfying a complete set or a subset of error correction constraints corresponding to the first bit value, finds a second set of combinations of one or more error events in the detected sequence satisfying a complete set or a subset of error correction constraints corresponding to the second bit value, selects a first most likely combination of one or more events of the first set and a second most likely combination of one or more events of the second set, and generates a bit reliability based on the first and the second most likely values.

20 Claims, 5 Drawing Sheets

US 8,037,394 B2

TECHNIQUES FOR GENERATING BIT RELIABILITY INFORMATION IN A POST-PROCESSOR USING AN ERROR CORRECTION CONSTRAINT

BACKGROUND OF THE INVENTION

The present invention relates to techniques for correcting errors, and more particularly to techniques for generating bit reliability information.

When a data sequence is read from a magnetic hard disk using a hard disk drive, the data sequence can be estimated by running the signal samples at the output of the channel through a Viterbi detector. A Viterbi detector uses the principles of dynamic programming to find the most likely data sequence given a sequence of noisy observations of the channel.

Errors in the Viterbi detector output are most commonly isolated bits. However, the physical properties of the magnetic recording system make short bursts of errors reasonably common. These error events are sometimes described using '+', '−' and "0" characters. A "+" character represents a recorded binary zero detected as a one. A "−" character represents a recorded binary one detected as a zero. A "0" character represents a bit that is detected correctly. Thus, a +−+ error event might occur if a recorded pattern 001011 were detected as 010111, and a −0− error event might occur if 011101 were detected as 001001.

The Viterbi detected sequence can be improved (i.e., the number of errors in it can be reduced) by incorporating linear block code parity constraints and/or more accurate (longer) target response. However, these improvements come with an exponential increase in the complexity of the Viterbi detector. Instead of incorporating linear block code parity constraints and/or longer or better target response into the Viterbi detector itself, it is frequently more efficient to construct a separate parity post-processor that acts on the output of a Viterbi detector. A parity post-processor (PPP) is a signal processing module. A parity post-processor can, for example, be added to a Viterbi detector to enforce a parity code constraints and/or to re-compute more accurate metric values than the ones used by the Viterbi detector.

However, many error correction systems that contain a Viterbi detector and a parity post-processor do not provide a sufficient amount of protection against error events, and in particular do not provide high quality bit reliability information. Therefore, it would be desirable to provide an error correction system that can provide more robust techniques for correcting errors in data sequences and high quality bit reliability information.

BRIEF SUMMARY OF THE INVENTION

Systems and methods are provided that generate bit reliabilities for a detected sequence. A detector generates the detected sequence. According to one embodiment, a post-processor finds a first set of combinations of one or more error events in the detected sequence satisfying a complete set or a subset of error correction constraints corresponding to the first bit value, finds a second set of combinations of one or more error events in the detected sequence satisfying a complete set or a subset of error correction constraints corresponding to the second bit value, selects a first most likely combination of one or more events of the first set and a second most likely combination of one or more events of the second set, and generates a bit reliability based on the first and the second most likely values.

Various objects, features, and advantages of the present invention will become apparent upon consideration of the following detailed description and the accompanying drawings.

DETAILED DESCRIPTION OF THE INVENTION

Iterative decoders are able to effectively decode codes involving a large number of parity checks by dividing the parity checks into subsets and applying these subsets independently. Because only a subset of all parity checks are considered at any time, an iterative decoder does not necessarily decode directly to a codeword that satisfies all parity checks. Instead, it reinforces bits that are consistent with the parity checks considered and marks as unreliable bits that are inconsistent with these parity checks. On a subsequent iteration, bits that have been flagged as unreliable many times are eventually flipped.

In order to apply iterative decoding to a magnetic recording channel, a detector is used to decode a noisy read-back signal to binary data with an associated reliability value. It is also desirable to allow the detector to receive a prior estimate of each bit value and reliability. The prior estimates allow the detector to refine its estimate each time the system iterates. A detector of this type is referred to as a soft-input/soft-output detector, or simply a SISO detector. A modification of the Viterbi algorithm that can provide a soft output is referred to as the soft-output Viterbi algorithm or SOVA.

Soft information is often represented as a log-likelihood ratio (LLR). The soft information of a bit b is commonly represented by a log-likelihood ratio (LLR) shown in equation (1).

$$LLR(b) = \log\left\{\frac{Pr(b=1)}{Pr(b=0)}\right\} \quad (1)$$

In equation (1), Pr(b=1) represents the probability that bit b is 1, and Pr(b=0) represents the probability that bit b is 0. The sign of a LLR represents the most likely bit value. A positive LLR (LLR>0) means that a binary 1 is more likely, and a negative LLR (LLR<0) means that a binary 0 is more likely. The magnitude (i.e., absolute value) of the LLR represents the reliability. A larger magnitude LLR means a more reliable decision, and a smaller magnitude LLR means a less reliable decision.

Figure 1:
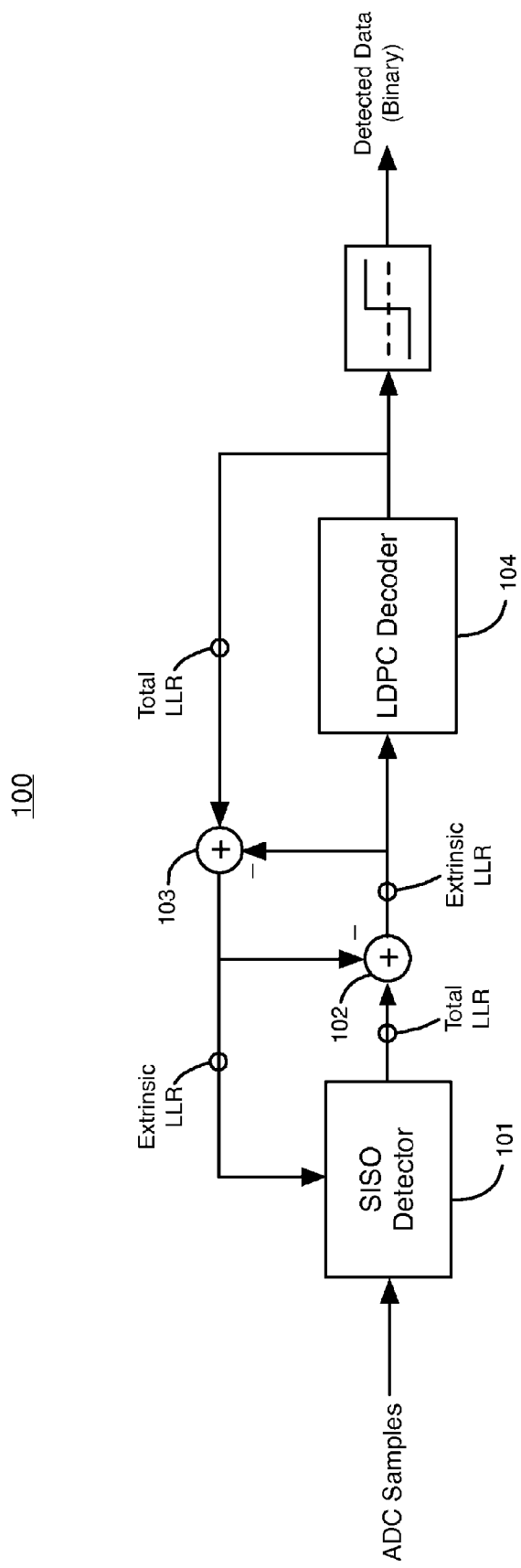
FIG. 1 illustrates an iterative decoder in which soft information is exchanged between a soft-input-soft-output (SISO) detector and a low density parity check code (LDPC) decoder, according to an embodiment of the present invention.

FIG. 1 illustrates an iterative decoder 100 in which soft information is exchanged between a soft-input-soft-output (SISO) detector 101 that analyzes the inter-symbol interference and a low density parity check code (LDPC) decoder 104, according to an embodiment of the present invention.

Soft-input-soft-output (SISO) detector 101 receives digitized read-back samples (ADC samples) and an estimate of the bit probability values from adder 103 (extrinsic LLR). This extrinsic LLR is initially zero, indicating 1 and 0 are equally likely.

SISO detector 101 computes the probability that each bit in the sequence is a 1 (total LLR) consistent with the input read-back signal and the extrinsic LLR information transmitted to it by adder 103. The influence of the input LLR information is subtracted from the total LLR at adder 102 to yield the extrinsic LLR, which is an input to LDPC decoder 104.

In a similar fashion LDPC decoder 104 computes the probability that each bit in the sequence is a 1 (total LLR) consistent with the constraints of a low density parity check (LDPC) code and LLR information presented to it from adder 102. The influence of the input LLR information is subtracted from the total at adder 103 to yield the extrinsic LLR, which is input to SISO detector 101. This procedure repeats until a prescribed stopping criterion is reached. When the stopping criterion is reached, the sign of each total LLR value is taken as the value for the corresponding data bit.

Although SISO detector 101 is shown with an LDPC decoder in FIG. 1, SISO detector 101 can be used with any kind of soft decoder (e.g. turbo, LDPC, soft Reed-Solomon etc.).

Figure 2:
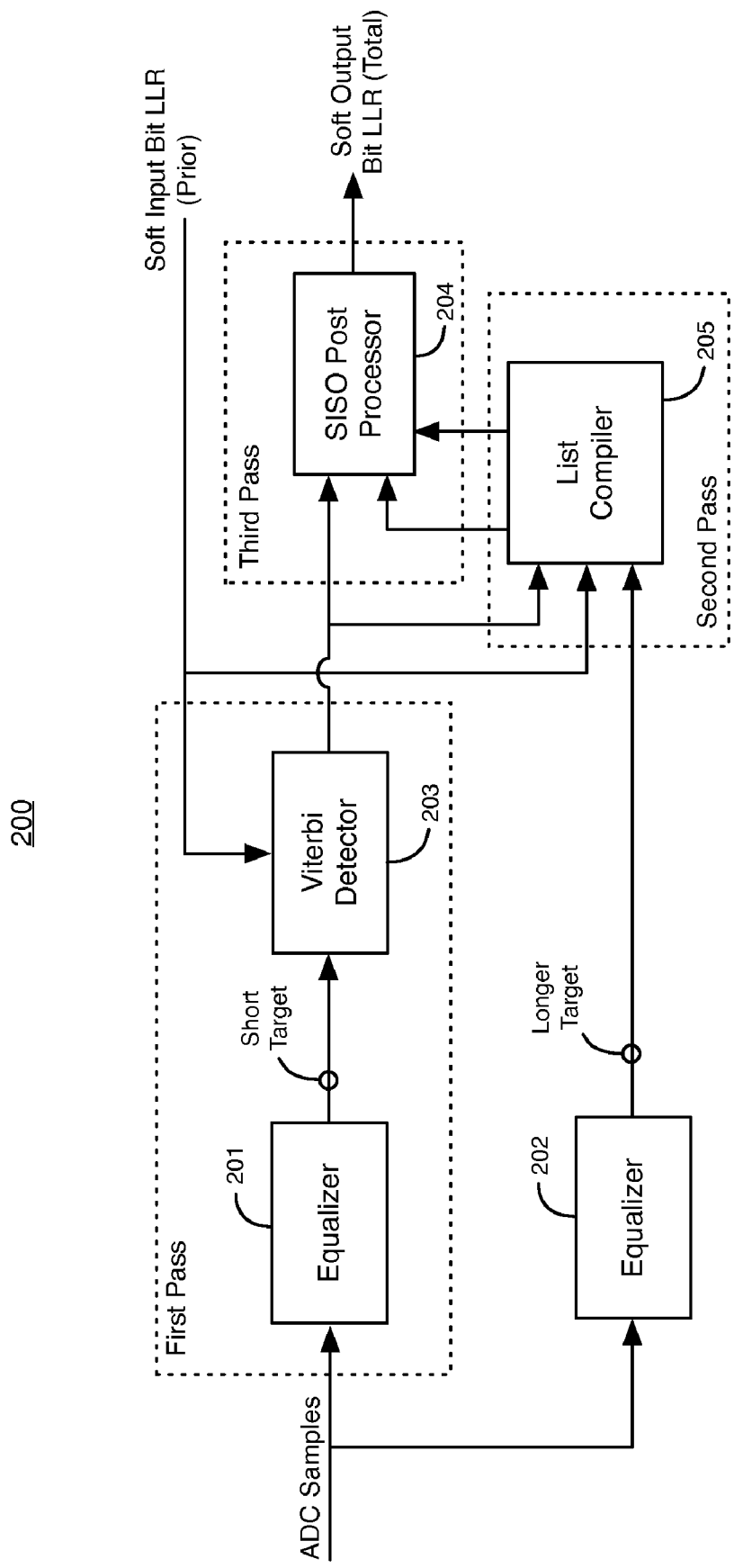
FIG. 2 illustrates a block diagram of a soft-input-soft-output (SISO) detector, according to an embodiment of the present invention.

FIG. 2 illustrates a block diagram of a SISO detector 200, according to an embodiment of the present invention. SISO detector 200 is an example of SISO detector 101 shown in FIG. 1.

In SISO detector 200, a finite impulse response (FIR) equalizer 201 receives digitized read-back samples (ADC samples) and reshapes the readback signal into a short target response at its output as required by Viterbi detector 203. Viterbi detector 203 receives the equalized signal from equalizer 201 as an input signal.

Viterbi detector 203 can also receive an estimate of the bit probability values (soft input bit LLR) from adder 103. Viterbi detector 203 then outputs the most likely binary data sequence based on the input signals during a first pass of SISO detector 200. Alternatively, Viterbi detector 203 can output the most likely binary data sequence based on only the equalized signal from equalizer 201. According to other alternative embodiments, Viterbi detector 203 can be replaced with another type of detector.

A second FIR equalizer 202 receives the digitized read-back samples (ADC samples) and reshapes the readback signal to a longer target response at its output. The longer target response generated by equalizer 202 is able to more faithfully represent the behavior of the recording system than the short target response required by Viterbi detector 203. The equalized signal from equalizer 202 is transmitted to an input of list compiler block 205. The equalized output signal of equalizer 202 is delayed by a delay block (not shown) to compensate for the delay of Viterbi detector 203 so that the output signal of equalizer 202 corresponds to the bits output by Viterbi detector 203.

List compiler block 205 also receives the binary data sequence generated by Viterbi detector 203 at a second input. List compiler block 205 can also receive an estimate of the bit probability values (soft input bit LLR) from adder 103 at a third input. List compiler 205 outputs a list of most likely error events and their corresponding syndrome values.

It is assumed that a transmitted or recorded sequence is encoded using a linear parity block code. This means that every block of n transmitted or recorded bits represents a codeword in the underlying code, where n is the code length. Every block of n transmitted or recorded bits satisfies all the parity check constraints imposed by the underlying code. List compiler block 205 processes a sequence in blocks of n bits. Its output list of most likely error events corresponds to one block of length n bits and is provided after corresponding n equalized samples, n detected NRZ bits, and n prior soft input bit LLRs have been processed.

Any sequence of n bits has a syndrome value with respect to the underlying linear parity block code. Its syndrome uniquely represents violations of the code's parity check constraints. A syndrome of a particular error event starting at a particular position is a syndrome of a binary sequence of n bits having all zeros except at positions where the error event takes values '+' or '−'. Every codeword has a syndrome zero.

The binary data sequence output of Viterbi detector 203 is also transmitted to an input of soft-input-soft-output (SISO) post-processor 204. The binary data sequence output of Viterbi 203 is delayed by a delay block (not shown) to compensate for the delay of list compiler 205. SISO post-processor 204 also receives a matched filtered error signal from list compiler block 205 and a list of the most likely error events and their syndrome values from list compiler 205. The matched filtered error signal output by list compiler block 205 is delayed by a delay block (not shown) before being transmitted to SISO post-processor 204 to compensate for the delay in list compiler block 205 between the generation of the matched filtered error signal output and the generation of the list of most likely error events and their syndrome values.

SISO post-processor 204 outputs the conditional probability that each data bit is a binary 1. The probability output by post-processor 204 can, for example, be expressed as a log likelihood ratio (LLR) that corresponds to a reliability value for each bit.

Figure 3:
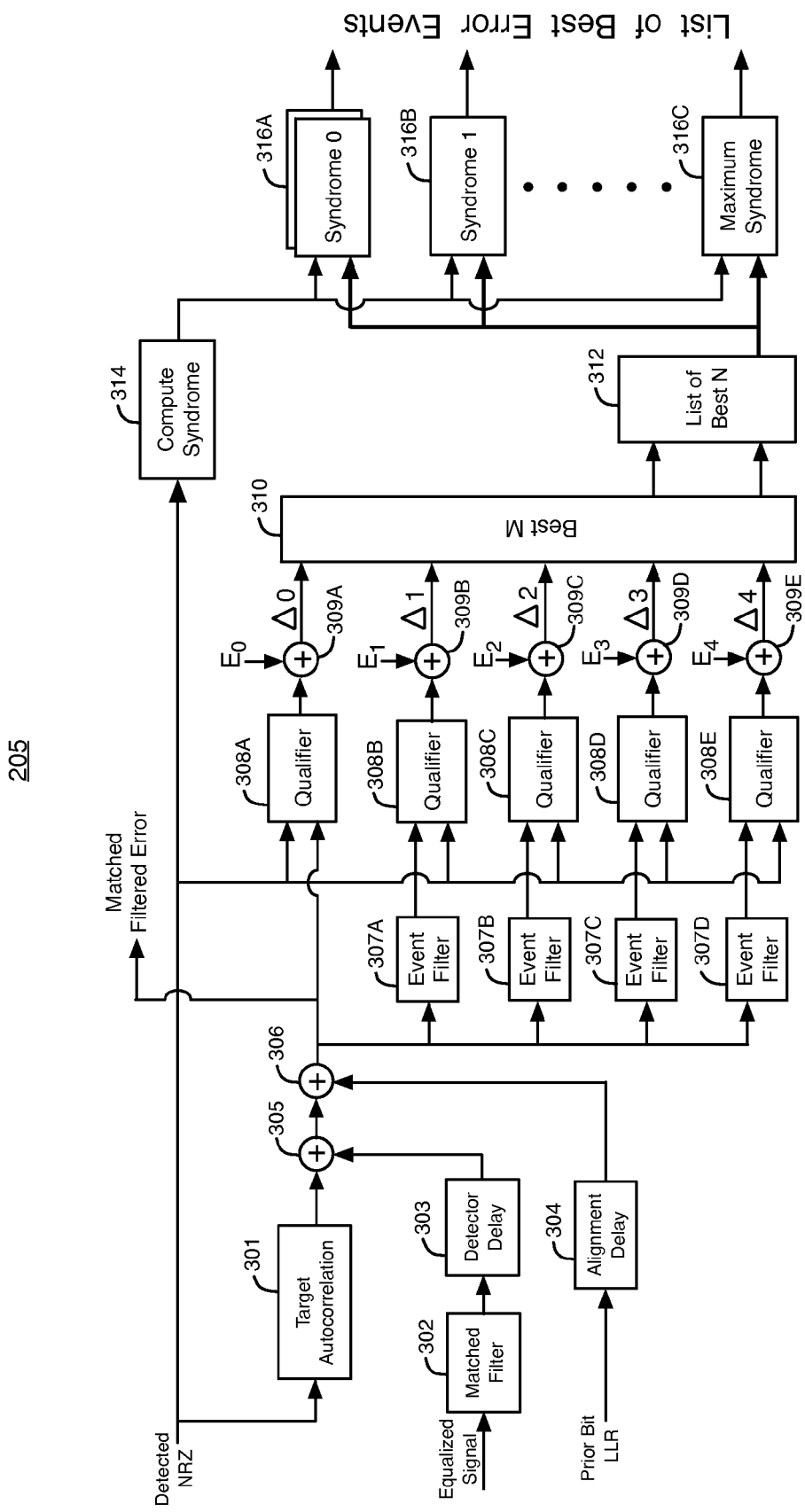
FIG. 3 illustrates a list compiler block that generates a list of most likely error events, according to another embodiment of the present invention.

FIG. 3 illustrates an example of list compiler 205, according to another embodiment of the present invention. List compiler 205 generates a list of the most likely error events of a parity block in the detected sequence during the second pass of SISO detector 200. The list of most likely error events generated by list compiler 205 can include combinations of error events.

List compiler 205 receives the equalized signal and applies a filter matched to the post-processor target at matched filter block 302. The resulting matched filtered value output by block 302 is delayed by detector delay block 303 to accommodate the latency of Viterbi detector 203.

Figure 4:
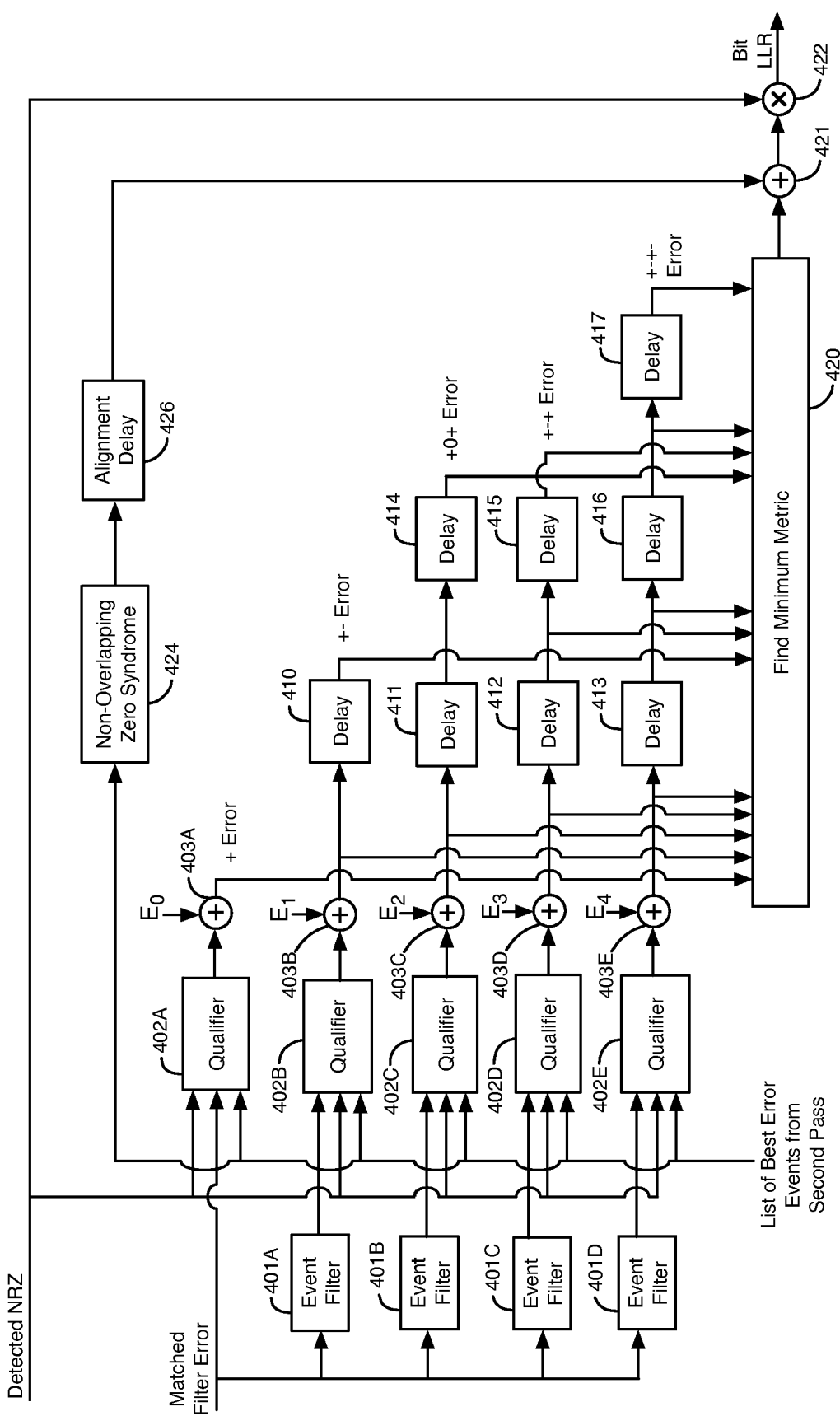
FIG. 4 illustrates an example of a soft-input-soft-output (SISO) post-processor, according to another embodiment of the present invention.
Figure 5:
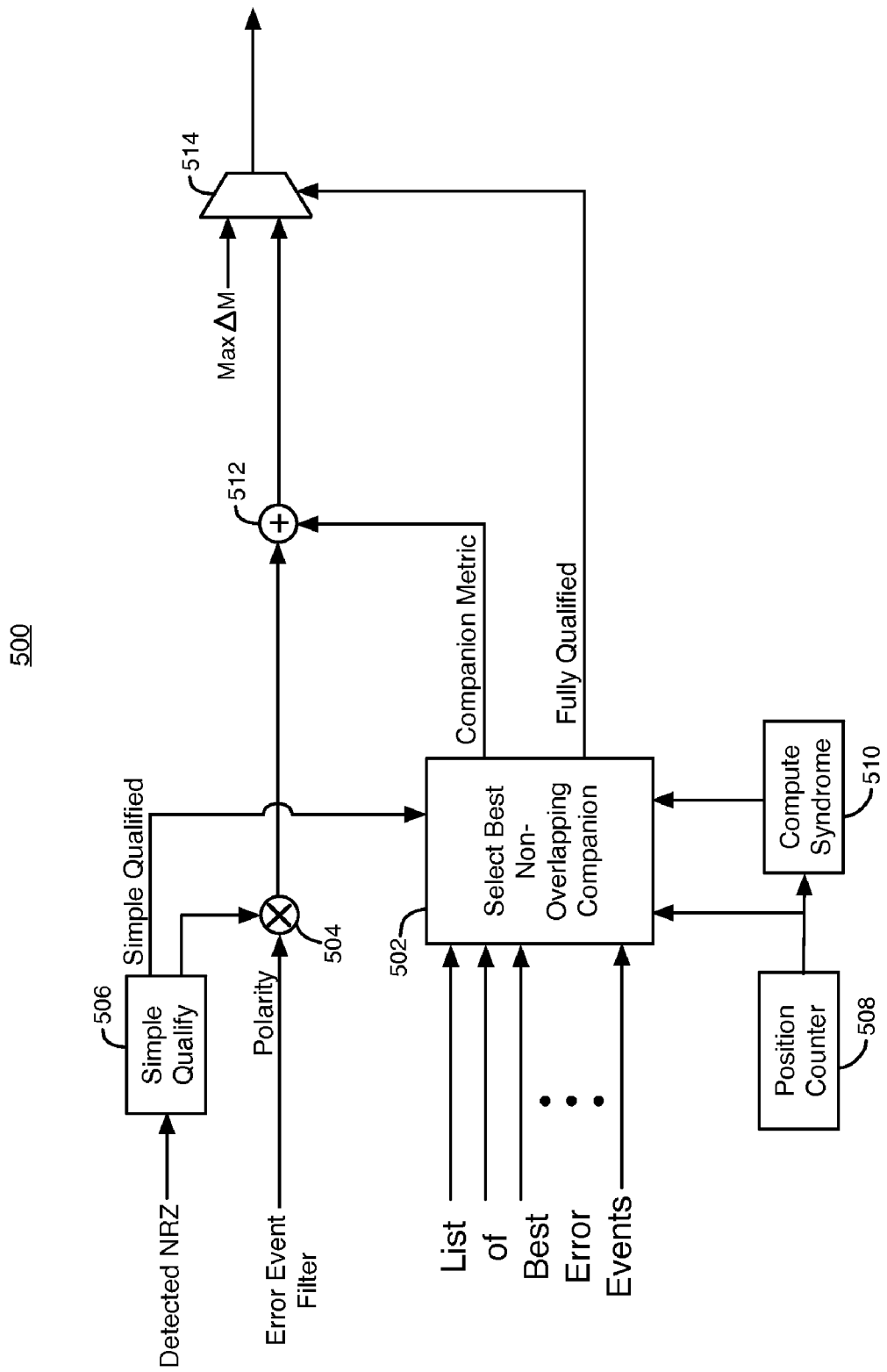
FIG. 5 illustrates an example of a syndrome qualifier that can be used in the SISO post-processor shown in FIG. 4, according to another embodiment of the present invention.

Viterbi detector 203 outputs a data sequence that can be represented in any desired format. In the examples of FIGS. 3-5, detector 203 generates an output sequence in a standard NRZ (non-return-to-zero) format. List compiler 205 receives the detected NRZ data from Viterbi detector 203 and convolves this detected NRZ data sequence with the autocorrelation of the post-processor target using target autocorrelation block 301 to obtain the output of the matched filter that would be expected in the absence of noise or errors.

Adder 305 subtracts the output value of target autocorrelation block 301 from the delayed matched filter (that is output by block 303) to obtain an estimate of the matched-filtered noise sequence. List compiler 205 optionally accepts an estimate of the prior bit probability (LLR) values from adder 103. The prior bit LLR values are delayed by alignment delay block 304 and then combined with the matched filtered error signal at adder 306.

The difference metric Δ0 of a single bit error is computed by optionally flipping the sign of the modified matched filtered error signal from adder 306 in qualifier 308A according to the value of the corresponding detected data bit. The output signal of qualifier 308A is added to the error event energy term $E_0$ at adder 309A to generate a difference metric Δ0. Other error event energy terms are indicated by $E_1$-$E_4$ in FIG. 3.

Event filters 307A-307D store a set of multi-bit error events. However, multi-bit error events are not always possible. Therefore, each multi-bit error event is qualified by checking that the detected data sequence is consistent with each multi-bit error event using qualifiers 308B-308E. A predefined value that indicates the error event is not qualified is assigned to the difference metric of the unqualified error event.

The difference metrics of multi-bit error events are computed by combining the modified matched filtered error values from adder 306 for all of the bits affected by each of the error events at event filters 307A-307D, optionally flipping the signs according to the values of the corresponding detected data bits using qualifiers 308B-308E, and adding the results to the appropriate error event energy terms $E_1$-$E_4$ at adders 309B-309E. Each of the output signals Δ0-Δ4 of adders 309A-309E represents a difference metric.

Every sequence of bits is given a metric. Every error event starting at a particular bit location is given a difference metric. The difference metric for each error event is calculated as the difference between the metric assigned to the detected NRZ sequence by Viterbi 203 and a metric assigned to a sequence that differs from the detected NRZ sequence by a particular error event at a particular bit location.

Alternatively, each of the output signals Δ0-Δ4 of adders 309A-309E can represent a formal LLR, i.e. the log of a ratio of the likelihood that the recorded bit pattern differs from the detected NRZ sequence by a specific error pattern and the likelihood that it does not differ from the detected NRZ sequence. A formal LLR and a difference metric can differ up to a multiplicative constant. For simplicity, the output signals Δ0-Δ4 of adders 309A-309E are referred to herein as the difference metrics.

The output signal Δ0 of adder 309A represents the difference metric of a single bit error event. The output signals Δ1-Δ4 of adders 309A-309E represent the difference metrics of 4 multi-bit error events. These error events can, for example, represent all error events that could have affected the current bit.

In the example of FIG. 3, qualifier 308A and adder 309A compute the difference metric Δ0 for a + error event in the output of Viterbi detector 203. Event filter 307A, qualifier 308B, and adder 309B compute the difference metric Δ1 for a +− error event in the output of Viterbi detector 203. Event filter 307B, qualifier 308C, and adder 309C compute the difference metric Δ2 for a +0+ error event in the output of Viterbi detector 203. Event filter 307C, qualifier 308D, and adder 309D compute the difference metric Δ3 for a +−+ error event in the output of Viterbi detector 203. Event filter 307D, qualifier 308E, and adder 309E compute the difference metric Δ4 for a +−+− error event in the output of Viterbi detector 203.

The difference metrics Δ0-Δ4 generated by adders 309A-309E are transmitted to best M block 310. Best M block 310 selects the best (i.e., most likely) error events with respect to one particular time interval. The best error events in each time interval can, for example, correspond to the error events that have the minimum difference metric values. Best M block 310 can, as an example, select 2 of the of the most likely error events in each time interval (M=2). Although, best M block 310 can select any desired number of the best error events in each time interval.

The difference metrics for the best M error events in each time interval are transmitted from best M block 310 to list of best N block 312. List of best N block 312 selects the most likely N number of error events in each parity block in the detected sequence from the group of error events selected by block 310 for that parity block. List of best N block 312 stores an error type, a bit location where the error event started, a difference metric, and a syndrome value for each of the best N error events in each parity block. The error type indicates the type of error event (e.g., +−, +−+, etc.). The syndrome value can be computed using one or more parity check constraints or other type of error correction constraints.

List of best N block 312 can, for example, narrow down the list of best error events sent from block 310 by selecting the N error events for each parity block that have the smallest difference metric values. As example, block 312 can select the best 8 error events for each parity block, where block 310 selects more than 8 error events in each parity block.

In the example given in FIG. 3, block 310 selects best events for each time interval, and block 312 selects best events affecting any bit in the current parity block. As another example, M can be equal to the number of error types, and block 310 can be omitted.

Block 314 computes the syndrome for the current parity block in the detected NRZ sequence from Viterbi detector 203 using one or more parity check constraints or other type of error correction constraints. The computed syndrome is transmitted from block 314 to blocks 316A-316C.

Blocks 316A-316C, etc. select the best error events (i.e., most likely error events) from block 312 that drive the syndrome of the parity block in the detected sequence from Viterbi detector 203 to each possible syndrome value using the error correction constraints. The best error events may include the best combination of error events. The syndrome of the parity block in the detected sequence can be driven to different values by applying different error events to the parity block. The best error event or combination of error events for a particular syndrome value of the parity block can be determined by selecting the error event (or combination of error events) that has the minimum difference metric value for that syndrome value.

In another example, blocks 316A-316C do not have to correspond to one particular syndrome value. Each of the blocks 316A-316C can correspond to groups of syndrome values. This becomes useful if the maximum number of syndromes is fairly large. In yet another example, all syndromes can be grouped together and there may be only one block 316A.

In the example given in FIG. 3, block 316A selects the best error event or combination of error events from block 312 that drives the syndrome of the parity block in the detected sequence to zero. Block 316B selects the best error event or combination of error events from block 312 that drives the syndrome of the parity block in the detected sequence to 1. Block 316C selects the best error event or combination of error events from block 312 that drives the syndrome of the parity block in the detected sequence to the maximum syndrome value.

Alternatively, block 316A can select two or more of the best error events or combinations of error events from block 312 that drive the syndrome of the parity block in the detected sequence to zero. For example, block 316A can select the best and the second best error events that drive the syndrome of the parity block to zero. Also, block 316B can alternatively select two or more of the best error events or combinations of error events from block 312 that drive the syndrome of the parity block in the detected sequence to 1. Block 316C can also select two or more of the best error events or combinations of error events from block 312 that drive the syndrome of the parity block in the detected sequence to the maximum value.

Blocks 316 can, for example, perform an XOR Boolean function on the syndrome of an error event and the syndrome of a parity block in the detected sequence to determine the syndrome of that parity block having that error event. Blocks 316 can, for example, perform an XOR Boolean function on the syndromes of a combination of error events and the syndrome of a parity block in the detected sequence to determine the syndrome of that parity block with that combination of error events.

In this example, list compiler 205 has a separate block 316 for selecting one or more of the best error events from block 312 that drive the parity block in the detected sequence to each possible syndrome value of that parity block. For example, if there are 4 possible syndrome values of the parity block, then list compiler 205 has 4 blocks 316 that can select one or more of the best error events that drive the parity block in the detected sequence to each possible syndrome value.

If the null error event is the most likely error event for a particular syndrome, then the corresponding block 316 outputs a difference metric value of zero indicating that the detected sequence is the most likely solution. If none of the error events output by block 312 drive the syndrome of the parity block in the detected sequence to a particular syndrome value, then the corresponding block 316 outputs a difference metric indicating that an error event that drives the syndrome of the detected sequence to that syndrome value is unlikely.

According to an alternative embodiment, blocks 316 can select the best one or more error events for each possible syndrome value of the error events, instead of each possible syndrome value of the parity block in the detected sequence having the error event.

The output of blocks 316 in list compiler 205 is a list of the best error events and corresponding syndrome values of the detected sequence. The outputs of blocks 316 are transmitted to soft-input-soft-output (SISO) post-processor 204.

FIG. 4 illustrates a diagram of SISO post-processor 204, according to an embodiment of the present invention. SISO post-processor 204 generates soft output bit LLR values during the third pass of SISO detector 200.

SISO post-processor 204 receives the detected sequence from Viterbi detector 203 (e.g., in NRZ format). SISO post-processor 204 also receives the matched filtered error signal from adder 306 in list compiler 205.

Event filters 401A-401D store the same error events as event filters 307A-307D, respectively. The matched filtered error values for all of the bits affected by the error event are combined using event filters 401A-401D.

Qualifiers 402A-402E receive the matched filtered error signal and the output signals of event filters 401A-401D, respectively, the detected NRZ sequence, and the list of best error events and corresponding syndrome values from list compiler 205. Qualifiers 402A-402E qualify the error event stored in event filters 401A-401D, respectively, using the list of best error events for each syndrome from list compiler 205. Specifically, each qualifier 402A-402E attempts to locate a companion error event (or events) in the error list from compiler 205.

A companion error event (or events) has to satisfy the following two conditions. The first condition requires that it does not overlap with the single bit error event at the current position (for qualifier 402A) or the error event from the corresponding event filter 401A-401D (for qualifiers 402B-E). The second condition requires that when the companion error event (or events) is combined with the single bit error event at the current position or the error event from the corresponding event filter 401A-401D, they together drive the syndrome of the parity block in the detected sequence to zero. In other words, a companion error event of a single bit error event at the current position or an event in one of the error filters 401A-401D is the most likely non-overlapping event on the list from compiler 205, such that the two events together result in a sequence that has syndrome zero. An error event and companion error event(s) that drive the syndrome of the parity block to zero are error events that cause the parity block to satisfy a predefined set of parity constraints (or other error correction constraints) when those error events are applied to the detected sequence corresponding to the parity block.

Typically, a companion error event from compiler 205 combined with a single bit error event at the current position or an error event from a filter 401 drives the syndrome of the detected sequence to zero when the syndrome corresponding to the companion error event stored in the list is the same value as the syndrome of the single bit error event at the current position or the error event from filter 401. Qualifiers 402A-402E preferably select the most likely non-overlapping companion error event having the minimum difference metric that drives the syndrome of the parity block to zero when combined with the single bit error event at the current position or the error event from the corresponding filter 401. If the most likely error event with the required corresponding syndrome value overlaps the single bit error event at the current position or the error event from filter 401, then the qualifier 402 selects the next most likely error event that does not overlap the single bit error event at the current position or the error event from filter 401 and that drives the syndrome of the parity block to zero when combined with the single bit error event at the current position or the filter 401 error event. Blocks 316A-316C etc. can select and store multiple best error events for each syndrome value in case the best error event for one syndrome value is overlapping.

The difference metrics of the multi-bit error events from filters 401 (or the matched filtered error signal in case of a single bit error) combined with companion error events from compiler 205 are computed by adding the appropriate error event energy term $E_0$-$E_4$ to the outputs of qualifiers 402A-402E at adders 403A-403E. Each of the output signals of adders 403A-403E represents a difference metric. Furthermore, each output signal of adders 403A-403E represents a difference metric for a single bit error event or multi-bit error events from a filter 401A-401D combined with companion error event(s) from compiler 205.

SISO post-processor 204 stores the difference metrics for multiple errors in a FIFO buffer that includes a set of latches 410-417 shown in FIG. 4. Each of the latches 410-417 functions as a delay circuit that stores the difference metrics for each error event. Latches 410-417 can, for example, be controlled by a clock signal (not shown).

The difference metrics output by adders 403B-403E are transmitted to and initially stored in latches 410-413, respectively, as shown in FIG. 4. The bit log-likelihood ratio (LLR) generated at the output of SISO post-processor 204 corresponds to the current bit location. The difference metrics at the outputs of adders 403A-403E correspond to the error events at the current bit location.

Each column of latches in FIG. 4 stores the difference metrics for events at a previous bit location. Latches 410-413 store difference metrics for the events corresponding to the previous bit location. Latches 414-416 store difference metrics for the events corresponding to the second previous bit location. Latch 417 stores a difference metric for the events corresponding to the third previous bit location.

The difference metrics for a +− error event combined with companion error event(s) from compiler 205 are shifted into latch 410. The difference metrics for a +0+ error event combined with companion error event(s) from compiler 205 are serially shifted through latches 411 and 414. The difference metrics for a +−+ error event combined with companion error event(s) from compiler 205 are serially shifted through latches 412 and 415. The difference metrics for a +−+− error event combined with companion error event(s) from compiler 205 are serially shifted through latches 413, 416, and 417.

The configurations of list compiler 205 and SISO post-processor 204 in FIGS. 3 and 4 are shown merely as an example of the present invention. For example, the number of event filters and qualifiers can be greater than or less than the number shown in FIGS. 3 and 4, depending on the number of error events that are analyzed. Also, the number and type of error filters 310, 312, and 316 can be different than the ones shown in FIG. 3. In addition, the number of latches in SISO post-processor 204 can be greater than or less than the number of latches shown in FIG. 4, depending on the number and type of error events that are analyzed.

SISO post-processor 204 uses the difference metric value of multiple error events that flip the current bit to compute the reliability of multiple bits. A multi-bit error starting in one of several locations could flip the same bit value.

The difference metric outputs of adders 403A-403E and the difference metrics stored in latches 410 and 412-417 are transmitted to block 420. In the example of FIG. 4, block 420 in SISO post-processor 204 analyzes a set of 12 error events that flip the current bit. Block 420 selects the most likely error event out of these 12 error events. The most likely error event can be, for example, the error event having the minimum difference metric.

SISO post-processor 204 generates a bit LLR at the output of multiplier 422. The bit LLR is the log-likelihood ratio (LLR) for the bit location corresponding in time to the values at the outputs of adders 403A-403E. The magnitude of the bit LLR represents the reliability of the current bit.

In computing the reliability of the current bit, block 420 receives a difference metric for a single + bit error starting in the current bit location and combined with the difference metric of its companion error event(s) from adder 403A. Block 420 also receives difference metrics for a +− error event starting in the current bit location and the previous bit location, both combined with the difference metrics of their companion error events, from adder 403B and latch 410. Block 420 also receives difference metrics for a +0+ error event starting in the current bit location and a bit location that is two bit locations earlier, both combined with the difference metrics of their companion error events, from adder 403C and latch 414. Block 420 also receives difference metrics for a +−+ error event starting in the current bit location and in the two previous bit locations, all three combined with the difference metrics of their companion error events, from adder 403D and latches 412 and 415. Block 420 also receives difference metrics for a +−+− error event starting in the current bit location and in the three previous bit locations, all four combined with the difference metrics of their companion error events, from adder 403E and latches 413 and 416-417. After analyzing all 12 of these error events that flip the current bit, block 420 selects the error event having the minimum difference metric.

The minimum difference metric corresponds to the most likely error event combination flipping a bit at a particular bit location. Thus, block 420 determines the most likely error event combination that flips the current bit by selecting the error event combination having the minimum difference metric. The most likely error event combination corresponds to a negative metric when the error event combination is more likely than the output of the Viterbi detector. Due to qualifiers 402A-402E, the combination of error events selected as the most likely by block 420 also drives the syndrome of the parity block to zero, i.e. when applied to the detected sequence corresponding to the parity block, and results in a codeword that satisfies a specified set of parity constraints.

According to an alternative embodiment, SISO post-processor 204 can be configured such that the maximum metric corresponds to the most likely error event at a particular bit location. In this embodiment, block 420 computes the maximum metric for a combination of error events that flips the current bit.

In FIG. 4, SISO post-processor 204 computes the tentative reliability measure as the difference of two quantities (metrics). The first quantity (Q1) is the minimum difference metric among all error events that flip the current bit as selected by block 420. The second quantity (Q2) is the difference metric for the error event or combination of error events that does not flip the current bit and that has a zero syndrome. Q2 is selected by block 424 by performing a search of the list provided at the output of the list compiler 205. Thus, the tentative reliability measure=Q1−Q2.

Block 424 can select the most likely error event chosen by block 316A that causes the syndrome of the parity block in the detected sequence to be driven to zero and that does not flip the current bit. Block 424 can, for example, select the error event chosen by block 316A having the minimum difference metric, if that error event does not flip the current bit.

As mentioned above, block 316A can select two or more of the best error events or error event combinations that drive the syndrome of the parity block in the detected sequence to zero. If the best error event or error event combination that drives the syndrome of the parity block to zero flips the current bit, then block 424 can select the next best error event or error event combination that drives the syndrome of the parity block to zero and that does not flip the current bit. If block 316A is limited to selecting only two error events or combinations of error events that drive the syndrome of the parity block to zero, a constraint in block 316A should require that the two selected error events or combination of error events do not overlap each other.

If within a list of best events from a list compiler 205, a best event or combination of non-overlapping events that provides overall syndrome zero cannot be identified, the third pass of the decoder in block 204 cannot be performed. These situations are very rare, especially if the number N of events on the list and the number of error event types considered is large. However, if these situations occur, the bit LLR can be computed with the parity constraints ignored for that particular block as described in commonly-assigned, co-pending U.S. patent application Ser. No. 11/771,226, filed Jun. 29, 2007, which is incorporated by reference herein, or the whole block can be identified as very unreliable by setting the LLR magnitude of the corresponding bits to a predefined small number. U.S. patent application Ser. No. 11/771,226 describes techniques for generating bit reliabilities in the post-processor when the data sequence does not satisfy any parity constraints or when any existing parity constraints are ignored. Embodiments of the present invention, on the other hand, provide techniques for generating bit reliabilities for sequences that are constrained with a linear block code.

If block 424 can identify only one best event or combination of non-overlapping events that provides overall syndrome zero, the output of block 424 for the bits changed (flipped) by the selected best event combination has to be set to a value that indicates a very small likelihood.

The difference metric selected by block 424 is delayed by alignment delay block 426 before being transmitted to adder 421 to compensate for the delay in SISO post-processor 204. Adder 421 subtracts the difference metric selected by block 424 from the minimum difference metric selected by block 420. The output of adder 421 is translated to a bit LLR value by multiplying the output of adder 421 by the detected NRZ sequence from Viterbi detector 203 using multiplier 422. The magnitude of the bit LLR output value of multiplier 422 represents a bit reliability. Some of the selected error events can be applied to one, two, three, or more of the previous bits by multiplier 422, depending on the error event and the detected sequence.

FIG. 5 illustrates an example of a syndrome qualifier 500 that can be used in the SISO post-processor shown in FIG. 4, according to another embodiment of the present invention. Syndrome qualifier 500 shown in FIG. 5 is an example of each of qualifiers 402A, 402B, 402C, 402D, and 402E shown in FIG. 4.

Syndrome qualifier 500 includes select best non-overlapping companion block 502, a position counter 508, a syndrome compute block 510, a multiplier 504, a simple qualify block 506, an adder 512, and a multiplexer 514. Simple qualify block 506 receives the detected NRZ sequence and determines whether the underlying error event (considered in the corresponding error event filter) or its complementary error event is plausible. If the error event or its complement is plausible, the Simple Qualified output of block 506 is set to logical 1. Otherwise, the Simple Qualified output of block 506 is set to logical 0. In the case of a single bit error ('+') and its complement ('−'), one or the other is always plausible. Consequently, the Simple Qualified output of block 506 is always set to logical 1 for a single bit error.

The second output of the Simple Qualify Block 506 (Polarity) that is transmitted to multiplier 504 generates either +1 or −1. When Simple Qualified output is logical 1, Polarity indicates whether the corresponding error event itself or its complement is the one that is qualified. For example, +1 is generated if the original event (e.g. +−+) is the one that is plausible (simple qualified), and −1 is generated if the complement of the original error event (e.g. −+−) is the one that is plausible (simple qualified). Multiplier 504 can flip the sign of the output of the error event filter. This happens when Polarity=−1. If neither the original event nor its complement are qualified (Simple Qualified output is logical 0), Polarity can be either +1 or −1, and its value is irrelevant because Max Δ (indicating very low likelihood of the corresponding event) will be generated at the output of block 500.

The Simple Qualified output represents one input to the select best non-overlapping companion block 502. Block 502 also receives as other inputs the current position determined at the output of the position counter block 508, the syndrome of the underlying error event computed in the compute syndrome block 510, and the list of best error events provided by list compiler 205. If the Simple Qualified output is logical 1, the select best non-overlapping companion block 502 performs a search for a companion error event of the underlying error event (considered in the corresponding event filter). The companion error event is the best (i.e., most likely) error event on the list with the required corresponding syndrome value (commonly equal to the syndrome of the underlying error event at the output of compute syndrome block 510) that does not overlap with the underlying error event (considered in the error event filter). The required syndrome for the companion event is such that the companion error event and the underlying error event together drive the syndrome of the detected block to zero.

If the search is successful, the difference metric of the companion error event is provided at the Companion Metric output of the select best non-overlapping companion block 502. Another output of the select best non-overlapping companion block 502 is denoted by Fully Qualified. The Fully Qualified output is set to logical 1 if the Simple Qualified output is logical 1, and if the search for the companion event in the select best non-overlapping companion block 502 is successful. Otherwise, the Fully Qualified output is set to logical 0. Adder 512 combines the difference metric of the companion error event (Companion Metric) with the value at the output of multiplier 504 and provides the result to the output of the multiplexer 514 when the Fully Qualified output equals 1. When the Fully Qualified output equals 0 (e.g., the underlying error event stored in the error filter is not qualified or the companion error event is not found), multiplexer 514 generates a predefined value at its output (Max ΔM) indicating a very unlikely error event. When the Fully Qualified output equals 0, the value at the Companion Metric output is not relevant and can take any arbitrary dummy value.

Techniques of the present invention, including the blocks shown in FIGS. 1-5 can be implemented in hardware, in software, or in a combination of hardware and software.

The Viterbi detected sequence and an alternative sequence can be compared using a metric. Every bit sequence is given a metric M, which represents the distance between the ideal response (or ideal signal) corresponding to the bit sequence and the received signal. The closer the two signals are, the smaller the metric, and the better the estimate of the bits. In general, metrics are positive, because a metric represents a distance.

Every error filter in every time instance computes a difference metric Δ. The difference metric Δ can be calculated using equation (2) below, where M is a metric of the sequence obtained by applying an error event to the Viterbi sequence in one particular time instant, and $M_{Viterbi}$ is the metric of the Viterbi sequence.

$$\Delta = M - M_{VITERBI} \quad (2)$$

Because the Viterbi sequence is the best in most cases (i.e., its metric is the smallest), the computed difference metric Δ is usually positive.

Techniques of the present invention can be implemented in error detection and correction decoders that are used in data storage devices such as magnetic hard disk drives and optical disk drives, and semiconductor memory systems such as RAM and non-volatile memories. Techniques of the present invention can also be implemented in error detection and correction decoders used in data transmission systems that transmit and receive data over communication links.

An example of an embodiment of the present invention is now described in detail. This example is provided merely for the purpose of illustration and is not intended to limit the scope of the present invention. In this example, a linear block code used is a 2-bit interleaved parity, meaning that in any codeword, all bits at even positions satisfy a first parity constraint (add to zero modulo 2), and all bits at odd positions satisfy a second parity constraint (add to zero modulo 2). The code length n is n=12. It is assumed that after the second pass in list compiler 205, a list of best N=8 error events has been selected for a block of 12 detected NRZ bits d=(1, 1, 0, 0, 1, 1, 1, 0, 1, 0, 0, 1) at positions 1-12. In a sequence d of detected 12 NRZ bits, the underlined bits satisfy a first parity check constraint, and the non-underlined bits do not satisfy a second parity check constraint. Because the second parity check constraint is not satisfied, sequence d is not a codeword. Its syndrome is s(d)=(0,1), which indicates that the first parity check constraint is satisfied and the second parity check constraint is not satisfied. Note that any codeword has syndrome (0,0). The example of a list of best single error events found within the block d of detected NRZ bits is shown in Table 1.

TABLE 1

| Event ranking on the list | Error event value (the difference metric Δ) | Error event type | Position | Syndrome s(e) | Overall syndrome s(e)⊕s(d) |
|---|---|---|---|---|---|
| 1 | −2.7 | '+−+' | 7 | (0, 1) | (0, 0) |
| 2 | −1.5 | '+−' | 2 | (1, 1) | (1, 0) |
| 3 | −0.2 | '+' | 6 | (0, 1) | (0, 0) |
| 4 | +0.3 | '+−+' | 11 | (1, 1) | (1, 0) |
| 5 | +2.5 | '+' | 7 | (1, 0) | (1, 1) |
| 6 | +2.8 | '+−' | 0 | (1, 0) | (1, 1) |
| 7 | +3.2 | '+0+' | 7 | (0, 0) | (0, 1) |
| 8 | +5.7 | '+' | 10 | (0, 1) | (0, 0) |

In this example, it has been assumed that at least one best solution satisfying all parity constraints can be found. This assumption is true in this example, because the first (and the best) event in the list of error events output by list compiler 205 results in a bit sequence having an overall syndrome of zero. This best solution is denoted with a B. That is, B represents the best event or pair of non-overlapping events on the list from compiler 205 that results in the overall syndrome zero. From Table 1, it can be seen that B=1 in this example.

The difference metric of B is $\Delta_B$. If B consists of the single best event with difference metric Δ (as in our example), then $\Delta_B=\Delta$. If B consists of the pair of non-overlapping error events with difference metrics $\Delta_a$ and $\Delta_b$, either $\Delta_B=\Delta_a+\Delta_b$ or this expression is used as a good approximation. In this example, $\Delta_B=\Delta_1=-2.7$.

It was mentioned above that the difference metrics are mostly positive. However, if the target response for the post-processor is better than the target response for the detector, negative difference metrics can occur. When negative difference metrics occur, they can make a significant difference to the output. Thus, it can be more useful to consider examples that are not so common, but do occur, i.e., examples with negative difference metrics.

The bit LLR computation differs significantly for bits that are flipped by B and for the bits that are not flipped by B. In this example, $\Delta_B=-2.7$, and bits flipped by B are at positions 7, 8 and 9.

First, bit 1 is considered as an example of a bit not flipped by the best event or pair of events resulting in overall syndrome of zero. This means that the difference metric of the best sequence that satisfies the parity check constraints and does not flip the bit at position 1 is $\Delta_{MIN}(b)=\Delta_B=-2.7$. To find the LLR of the bit at position 1, the difference metric of the best sequence that satisfies the parity check constraints and flips the bit at position 1, $\Delta_{MIN}(b^C)$, is located during the third pass in block 420.

Table 2 below shows all events affecting the bit at position 1. Only two events are qualified (i.e., plausible). The notation NQ indicates non-qualified error events. This qualification is based on the plausibility of error events. In addition, each error event is further qualified by a successful search for a companion error event on the list formed in compiler 205.

TABLE 2

| | Bit Position | | | | | Error event value (the difference metric) Δ | Error event syndrome value | Companion error event from the list | Total difference metric |
|---|---|---|---|---|---|---|---|---|---|
| | −1 | 0 | 1 | 2 | 3 | | | | |
| | Detected bit value | | | | | | | | |
| | 0 | 0 | 1 | 1 | 0 | | | | |
| Error events affecting bit at position 1 | | | + | | | +9.8 | (1, 0) | 2 (Δ = −1.5) | +8.3 |
| | | + | − | | | +3.0 | (1, 0) | 2 (Δ = −1.5) | +1.5 |
| | | | + | − | | NQ | x | x | x |
| | + | − | + | | | NQ | x | x | x |
| | | + | − | + | | NQ | x | x | x |
| | | | + | − | + | NQ | x | x | x |
| | + | 0 | + | | | NQ | x | x | x |
| | | + | 0 | + | | NQ | x | x | x |
| | | | + | 0 | + | NQ | x | x | x |

In Table 2, it can be seen that there are two plausible error events that affect the bit in position 1. Both of these error events have syndrome s(e)=(1,0). The detected sequence has a syndrome of s(d)=(0,1). In order to drive the overall syndrome to zero, the companion error events for the two events should have a syndrome of s(e)⊕s(d)=(1,1), or equivalently the overall syndrome corresponding to the companion error event given in the last column in Table 1 should be equal to the syndrome of the considered error event s(e)=(1,0). As a result, the error events considered for companion events are events 2 and 4 on the list in Table 1.

Furthermore, a companion event should not overlap with the event it is paired with. This condition is satisfied for both event 2 and 4. Because error event 2 has a smaller difference metric, it is the more likely error event, and therefore, it is chosen to be the companion event.

The difference metric of the companion error event is combined with the difference metric of the currently considered error event to obtain the total difference metric in the last column of Table 2. The smallest difference metric in the last column of Table 2 corresponds to the best combination of error events that drives the overall syndrome of the sequence to zero and that flips the bit at position 1. If the error event considered has syndrome equal to the syndrome of the detected sequence, a null companion error event is also considered, because this error event by itself is sufficient to drive the overall syndrome to zero.

Error event '+0+' starting at position 0 (in the second to the last row of Table 2) does not flip the bit at position 1. Thus, this error event is not considered even if it were plausible and qualified, because only the events that flip the bit at position 1 are considered in the third pass in block 420 during computation of the LLR of the bit at position 1.

During the third pass in block 204, the difference metric of the best sequence that satisfies the parity check constraints and flips the bit at position 1 is located using the techniques described above, $\Delta_{MIN}(b^C)=+1.5$. After computing $\Delta_{MIN}(b^C)$ and $\Delta_{MIN}(b)$, equation (3) can be used to determine the bit LLR.

$$LLR_1=(-1)^b(\Delta_{MIN}(b)-\Delta_{MIN}(b^C))=(-1)^1(-2.7-1.5)=+4.2 \quad (3)$$

If b takes values $-1$ and $+1$, where $-1$ corresponds to binary 0 and $+1$ corresponds to binary 1, equation (4) can be used to determine LLR.

$$LLR_1=b\cdot(\Delta_{MIN}(b^C)-\Delta_{MIN}(b))=(+1)\cdot(+1.5-(-2.7))=+4.2 \quad (4)$$

Sometimes $\Delta_{MIN}(b^C)$ cannot be found. The reason may be that there are not enough error events on the list formed in the second pass, so that for every considered plausible error event, its companion error event does not exist. For example, there are no error events of a required syndrome on the list, or all events of a required syndrome overlap with the event considered. This problem can be solved by assuming that a companion error event exists, but that it is very unlikely and that it was not kept on the list, i.e. $\Delta_{MIN}(b^C)$ is set to a fixed large positive value (e.g., +9999) to indicate a low probability of occurrence. However, note that this solution results in a very large LLR magnitude.

One of the bits flipped by best error event B is now considered, e.g., a bit at position 8. Because this bit is flipped by B, the difference metric of the best sequence that satisfies the parity check constraints and flips the bit at position 8 is $\Delta_{MIN}(b^C)=\Delta_B=-2.7$. This difference metric value is computed during the third pass and stored at the output of latch 412 during the time interval corresponding to bit at position 8. Hence, it will be at the input to the block 420. Because this value is also the best solution, it can be recognized that it will be at the output of the block 420 as well. However, to compute LLR of the bit at position 8, block 204 locates the difference metric of the best error event or pair of non-overlapping error events that results in an overall syndrome of zero but does not flip the bit at position 8 in block 424.

This error event or pair of error events can be found in the list formed during the second pass in compiler 205. In the example list in Table 1, this error event is single error event 3 ('+' error event at position 6). Error event 3 is the best error event among all single error events or pairs of non-overlapping error events on the list that drives the overall syndrome to zero and that does not flip the bit at position 8. Therefore, $\Delta_{MIN}(b)=-0.3$, and $LLR_8=(-1)^b(\Delta_{MIN}(b)-\Delta_{MIN}(b^C))=(-1)^0(-0.3-(-2.7))=+2.4$ In this example, three bits have been flipped by error event B. These three bits are the bits that have $\Delta_{MIN}(b^C)=\Delta_B$ and that need to have determined $\Delta_{MIN}(b)$ from the list. The computation of $\Delta_{MIN}(b)$ can be resolved using one of two techniques. The first technique involves performing the search for the best event or pair of events that drives the syndrome to zero and that does not flip each of the bits flipped by B. The second simpler technique involves finding one common second best solution B2 that does not overlap with solution B. Then, the second technique can be used for all bits flipped by B, and for every bit flipped by B, $\Delta_{MIN}(b)=\Delta_{B2}$.

In this example, the second best solution B2 found using the second technique is exactly error event 3 in the list, and $\Delta_{B2}=-0.3$. So the computed LLR for bits 7, 8 and 9 is the same whether the first or the second techniques is used. However, this may not be the case in general, and the first more complex technique may provide a slightly better LLR quality for bits flipped by B. On the other hand, the second technique is simpler, because the block 424 outputs only two values during the third pass, $\Delta_B$ and $\Delta_{B2}$, where $\Delta_B$ is provided at the output of 424 for bits not flipped by the best event(s) on the list that drive the overall syndrome to zero, and $\Delta_{B2}$ is provided at the output of 424 for all bits flipped by the best event(s) on the list that drive the overall syndrome to zero.

The foregoing description of the exemplary embodiments of the present invention has been presented for the purposes of illustration and description and are not intended to be exhaustive or to limit the scope of the present invention to the examples disclosed. A latitude of modification, various changes, and substitutions are intended in the present invention. In some instances, features of the present invention can be employed without a corresponding use of other features as set forth. Many modifications and variations are possible in light of the above teachings, without departing from the scope of the present invention. It is not intended that the scope of the present invention be limited with this detailed description.

The invention claimed is:

1. A system for generating bit reliabilities, the system comprising:
    a detector that generates a detected sequence; and
    a post-processor that finds a first set of combinations of at least one error event in the detected sequence satisfying error correction constraints corresponding to a first bit value, finds a second set of combinations of at least one error event in the detected sequence satisfying error correction constraints corresponding to a second bit value, selects a first most likely error event from the first set and a second most likely error event from the second set, and generates a bit reliability based on the first and the second most likely error events.

2. The system defined in claim 1 wherein the post-processor is a soft-input-soft-output post-processor.

3. The system defined in claim 1 wherein the post-processor comprises:
    error event filters that store multi-bit error events; and
    qualifiers that determine if each of the multi-bit error events is qualified based on the detected sequence.

4. The system defined in claim 1 wherein the detector is a Viterbi detector.

5. The system defined in claim 1 further comprising:
    a list compiler that generates a list of most likely error events for multiple syndrome values based on error correction constraints, wherein the list of most likely error events is transmitted to the post-processor.

6. The system defined in claim 5 wherein the list of most likely error events generated by the list compiler comprises error events for multiple syndrome values of a block in the detected sequence.

7. The system defined in claim 6 wherein the list of most likely error events generated by the list compiler comprises at least two most likely non-overlapping error events that drive the syndrome of the block in the detected sequence to zero.

8. The system defined in claim 5 wherein the post-processor selects a first error event and a second companion error event, wherein the second companion error event is an error event in the list of most likely error events that does not overlap the first error event, such that the first and the second companion error events together drive a syndrome of the detected sequence to zero.

9. The system defined in claim 8 wherein the post-processor comprises:
   latches that store probability values for the error events at different bit locations; and
   qualifiers that determine if an error event is qualified based on the second companion error event.

10. The system defined in claim 9 wherein the post-processor further comprises:
    a selector block that selects a most likely one of the probability values corresponding to error events that flip a current bit from among the probability values stored in the latches.

11. The system defined in claim 10 wherein the post-processor further comprises:
    a non-overlapping zero syndrome block that identifies a most likely error event from the list of most likely error events such that the most likely error event causes a syndrome of a block in the detected sequence to be driven to zero and does not overlap a current bit;
    an adder that receives an output of the selector block and an output of the non-overlapping zero syndrome block; and
    a multiplier that multiplies an output of the adder by a bit from the detected sequence, the bit having a value of +1 for a binary 1 and −1 for a binary 0.

12. A method for generating bit reliabilities using a post-processor, the method comprising:
    receiving a detected sequence from a detector;
    locating a first set of combinations of at least one error event in the detected sequence satisfying error correction constraints corresponding to a first bit value;
    locating a second set of combinations of at least one error event in the detected sequence satisfying error correction constraints corresponding to a second bit value;
    selecting a first most likely error event from the first set and a second most likely error event from the second set; and
    generating a bit reliability based on the first and the second most likely error events.

13. The method defined in claim 12 wherein the post-processor is a soft-input-soft-output post-processor.

14. The method defined in claim 12 further comprising:
    generating a list of most likely error events for multiple syndrome values based on error correction constraints.

15. The method defined in claim 14 wherein locating the first set of combinations of at least one error event in the detected sequence satisfying error correction constraints corresponding to the first bit value further comprises selecting a first error event and a second companion error event, wherein the second companion error event is an error event in the list of most likely error events that does not overlap the first error event, such that the first and the second companion error events together drive a syndrome of the detected sequence to zero.

16. The method defined in claim 14 wherein the list of most likely error events comprises error events for multiple syndrome values of a block in the detected sequence.

17. The method defined in claim 16 wherein the list of most likely error events comprises at least two most likely non-overlapping error events that drive a syndrome of the block in the detected sequence to zero.

18. A data storage device that generates bit reliabilities, the data storage device comprising:
    a detector that generates a detected sequence;
    a list compiler that generates a list of most likely error events for multiple syndrome values using error correction constraints; and
    a post-processor that finds a first set of combinations of at least one error event in the detected sequence satisfying error correction constraints corresponding to a first bit value, finds a second set of combinations of at least one error event in the detected sequence satisfying error correction constraints corresponding to a second bit value, selects a first most likely error event from the first set and a second most likely error event from the second set, and generates a bit reliability based on the first and the second most likely error events.

19. The data storage device defined in claim 18 wherein the post-processor selects a first error event and a second companion error event, wherein the second companion error event is an error event in the list of most likely error events that does not overlap the first error event, such that the first and the second companion error events together drive a syndrome of the detected sequence to zero.

20. The data storage device defined in claim 18 wherein the list of most likely error events generated by the list compiler comprises error events for multiple syndrome values of a block in the detected sequence based on a parity constraint.

* * * * *